United States Patent
Hiroi et al.

(10) Patent No.: US 9,240,501 B2
(45) Date of Patent: Jan. 19, 2016

(54) COMPOUND-BASED THIN FILM SOLAR CELL

(71) Applicant: Showa Shell Sekiyu K.K., Tokyo (JP)

(72) Inventors: Homare Hiroi, Tokyo (JP); Hiroki Sugimoto, Tokyo (JP)

(73) Assignee: Solar Frontier K.K., Tokyo (JP)

( * ) Notice: Subject to any disclaimer, the term of this patent is extended or adjusted under 35 U.S.C. 154(b) by 0 days.

(21) Appl. No.: 14/178,886

(22) Filed: Feb. 12, 2014

(65) Prior Publication Data

US 2015/0228811 A1 Aug. 13, 2015

(51) Int. Cl.
*H01L 31/0328* (2006.01)
*H01L 31/0216* (2014.01)
*H01L 31/032* (2006.01)

(52) U.S. Cl.
CPC ...... *H01L 31/02167* (2013.01); *H01L 31/0322* (2013.01); *H01L 31/0326* (2013.01)

(58) Field of Classification Search
CPC ............ H01L 31/0322; H01L 31/0336; H01L 31/0749; H01L 31/046; H01L 31/18; H01L 31/0326; H01L 31/0328; H01L 31/02167; H01L 21/36
See application file for complete search history.

(56) References Cited

U.S. PATENT DOCUMENTS

| | | | |
|---|---|---|---|
| 2006/0180200 A1* | 8/2006 | Platzer Bjorkman et al. | 136/265 |
| 2009/0087940 A1* | 4/2009 | Kushiya | 438/94 |
| 2010/0193018 A1* | 8/2010 | Feist et al. | 136/255 |
| 2011/0011451 A1* | 1/2011 | Hakuma et al. | 136/255 |
| 2011/0018089 A1* | 1/2011 | Hakuma et al. | 257/463 |
| 2011/0168258 A1* | 7/2011 | Palm | 136/258 |
| 2011/0232758 A1 | 9/2011 | Khanarian et al. | |
| 2012/0061247 A1* | 3/2012 | Ahmed et al. | 205/170 |
| 2012/0061790 A1* | 3/2012 | Ahmed et al. | 257/459 |

(Continued)

FOREIGN PATENT DOCUMENTS

| | | |
|---|---|---|
| JP | 2005-317563 | 11/2005 |
| JP | 2011-205086 | 10/2011 |

(Continued)

OTHER PUBLICATIONS

Nguyen, Q. et al. (2003). "Influence of Heterointerfaces on the Performance of Cu(In,Ga)Se$_2$ Solar Cells with CdS and in(OH$_x$,S$_y$) Buffer Layers," *Thin Solid Films* 431-432: 330-334.

(Continued)

*Primary Examiner* — Tan N Tran
*Assistant Examiner* — Fazli Erdem
(74) *Attorney, Agent, or Firm* — Morrison & Foerster LLP

(57) ABSTRACT

A compound-based thin film solar cell which has a high photovoltaic conversion efficiency is obtained. The compound-based thin film solar cell is provided with substrate (1), back surface electrode layer (2) formed on substrate (1), p-type light absorption layer (3) formed on back surface electrode layer (2), n-type high resistance buffer layer (4) formed on p-type light absorption layer (3), and ZnO film (5) formed on n-type high resistance buffer layer (4), where n-type high resistance buffer layer (4) includes a first buffer layer (4A) formed on the p-type light absorption layer (3) and a second buffer layer (4B) formed on the first buffer layer (4A) and where the second buffer layer (4B) is formed by a material which has a lattice constant closer to the lattice constant of the ZnO film (5) than the first buffer layer (4A).

9 Claims, 3 Drawing Sheets

(56) References Cited

U.S. PATENT DOCUMENTS

| | | | |
|---|---|---|---|
| 2012/0199173 A1* | 8/2012 | Bartholomeusz | 136/244 |
| 2012/0315721 A1* | 12/2012 | Park | 438/86 |
| 2013/0029450 A1 | 1/2013 | Jeong et al. | |
| 2013/0092236 A1* | 4/2013 | Kim | 136/262 |
| 2013/0146137 A1* | 6/2013 | Morimoto et al. | 136/256 |
| 2013/0269764 A1* | 10/2013 | Barkhouse et al. | 136/256 |
| 2013/0319502 A1* | 12/2013 | Chawla et al. | 136/246 |
| 2014/0007934 A1* | 1/2014 | Yun et al. | 136/256 |
| 2014/0034118 A1* | 2/2014 | Bojarczuk et al. | 136/255 |
| 2014/0038344 A1* | 2/2014 | Bojarczuk et al. | 438/86 |
| 2014/0053896 A1* | 2/2014 | Jost et al. | 136/255 |
| 2014/0054442 A1* | 2/2014 | Huang et al. | 250/200 |
| 2014/0090706 A1* | 4/2014 | Choi et al. | 136/256 |
| 2014/0109960 A1* | 4/2014 | Sugimoto et al. | 136/255 |
| 2014/0230888 A1* | 8/2014 | Kim et al. | 136/255 |
| 2014/0238479 A1* | 8/2014 | Lim et al. | 136/256 |
| 2014/0246087 A1 | 9/2014 | Hiraga et al. | |
| 2014/0315348 A1* | 10/2014 | Sugimoto et al. | 438/94 |
| 2014/0318623 A1* | 10/2014 | Lany | 136/260 |

FOREIGN PATENT DOCUMENTS

| | | |
|---|---|---|
| JP | 2011-205098 | 10/2011 |
| JP | 2012-28650 | 2/2012 |
| JP | 2013-106013 | 5/2013 |
| JP | 2013-529378 | 7/2013 |
| JP | 2013-151728 | 8/2013 |

OTHER PUBLICATIONS

International Search Report mailed Mar. 31, 2015, directed to International Application No. PCT/JP2015/053799, 11 pages.

\* cited by examiner

COMPOUND-BASED THIN FILM SOLAR CELL

FIELD

The present invention relates to a compound-based thin film solar cell, more particularly relates to a compound-based thin film solar cell which can achieve a high photovoltaic conversion efficiency.

BACKGROUND

In recent years, thin film solar cells which use p-type light absorption layers constituted by Group I-III-VI$_2$ compound semiconductors or Group I$_2$-(II-IV)-VI$_4$ compound semiconductors have come under the spotlight. Among these, cells which use chalcogenide structure Group I-III-VI$_2$ compound semiconductors which include Cu, In, Ga, Se, and S are called "CIS-based thin film solar cells". As typical materials, there are Cu(In, Ga)Se$_2$, Cu(In, Ga)(Se, S)$_2$, CuInS$_2$, etc. In particular, cells which include Ga are also called "CIGS-based thin film solar cells".

Further, cells which use p-type light absorption layers constituted by chalcogenide-based Group I$_2$-(II-IV)-VI$_4$ compound semiconductors which include Cu, Zn, Sn, S, or Se are called "CZTS-based thin film solar cells". As typical ones, there are Cu$_2$ZnSnS$_4$, Cu$_2$ZnSnSe$_4$, Cu$_2$ZnSn(S,Se)$_4$, etc.

These compound-based thin film solar cells use relative inexpensive, easily available materials, are relatively easy in processes of production, and further have large absorption coefficients in the visible to near infrared wavelength range, so a high photovoltaic conversion efficiency can be expected. Therefore, these are deemed as leading candidates for next generation solar cells.

A compound-based thin film solar cell, in general, is formed by successively stacking on a substrate a first electrode layer which forms a back surface electrode, a p-type light absorption layer, an n-type high resistance buffer layer, and a second electrode layer which forms a light receiving surface side electrode. Here, the n-type high resistance buffer layer can be formed from CdS, ZnS, InS, etc., but from the viewpoint of a good junction property with the p-type light absorption layer, CdS is usually used.

On the other hand, as a defect of a buffer layer which is formed by CdS, it is known that the layer easily cracks. If the n-type high resistance buffer layer has cracks inside it, at the time of forming the second electrode layer, the electrode material will enter into the cracks and a leakage current due to a shunt will be generated between the p-type light absorption layer and the second electrode layer. As a result, the solar cell product will fall in open circuit voltage (Voc) or fill factor (FF). The problem arises that the photovoltaic conversion efficiency (Eff) will fall along with this.

To solve this problem, to raise the function as a buffer layer (suppress shunt between the p-type light absorption layer and the second electrode layer etc.) and improve the photovoltaic conversion efficiency more, a structure comprised of a CdS layer on which an InS layer is stacked is known (see NPLT 1). However, in experiments conducted by the present inventors etc., by making the n-type high resistance buffer layer a stacked structure of a CdS layer and an InS layer, a certain extent of improvement was seen in the photovoltaic conversion efficiency, but the hoped for degree of improvement of performance was not seen. In particular, the problem was seen of a low open circuit voltage (Voc) and a large open circuit voltage loss (Voc, def=Eg−Voc).

NPLT 1. "Influence of heterointerfaces on the performance of Cu(In, Ga)Se2 solar cells with CdS and In(OHx, Sy) buffer layers", O. Nguyen et al., Thin Solid Films, 431-432 (2003) 330-334

SUMMARY

The present invention was made so as to solve the above problem and has as its object to discover a new configuration of an n-type high resistance buffer layer so as to provide a compound-based thin film solar cell which has an excellent photovoltaic conversion efficiency.

To solve the above problem, in a first aspect of the present invention, there is provided a compound-based thin film solar cell which is provided with a substrate, a back surface electrode layer which is formed on the substrate, a p-type light absorption layer which is formed on the back surface electrode layer, an n-type high resistance buffer layer which is formed on the p-type light absorption layer, and a ZnO film which is formed on the n-type high resistance buffer layer, where the n-type high resistance buffer layer includes a first buffer layer which is formed on the p-type light absorption layer and a second buffer layer which is formed on the first buffer layer and where the second buffer layer is formed by a material which has a lattice constant (lattice constant on a-axis, same below) which is closer to the lattice constant of the ZnO film than the first buffer layer.

In the first aspect, the first buffer layer may be formed by CdS and the second buffer layer may be formed by Zn(O,S) or Sn(O,S).

In the first aspect, the first buffer layer may be formed by InS and the second buffer layer may be formed by Zn(O,S) or Sn(O,S).

In the first aspect, the ZnO film may be formed by ZnO which includes an n-type dopant.

In the first aspect, the ZnO film may be formed by intrinsic ZnO and the ZnO film may be further formed over it with ZnO film which includes an n-type dopant.

In the first aspect, the ZnO film may be formed by intrinsic ZnO and the ZnO film may be further formed over it with an ITO film.

In the first aspect, the p-type light absorption layer may be formed by a CZTS-based semiconductor which includes at least Cu, Zn, Sn, and VI materials.

In the first aspect, the p-type light absorption layer may be formed by a CIS-based semiconductor which includes at least Cu, In, and VI materials.

Advantageous Effects of Invention

In a general compound-based thin film solar cell, a ZnO (zinc oxide) film is formed on an n-type high resistance buffer layer. The n-type high resistance buffer layer has a lattice constant which is considerably larger than the lattice constant of the ZnO film, so an open circuit voltage loss occurs due to the mismatch of the lattice constants between the n-type high resistance buffer layer and the ZnO film. Therefore, in the present invention, the n-type high resistance buffer layer is formed by a first buffer layer and a second buffer layer, and the side which is contiguous with the ZnO film, that is, the second buffer layer, is formed by a material which has a lattice constant which is closer to the lattice constant of the ZnO film than the first buffer layer. As a result, the second buffer layer which has a lattice constant which is closer to the lattice constant of ZnO than the first buffer layer contacts the ZnO film. The mismatch of the lattice constants at the interface between them is greatly suppressed and, as a result, the open circuit voltage loss can be reduced and further the open circuit voltage can be improved.

It is known that the lattice constant of the CdS buffer layer (lattice constant on a-axis, same below) is 5.82 Å (below, Å omitted), while the lattice constant of the ZnO film is 4.28. Furthermore, the lattice constant of InS is 7.62. Therefore, the inventors etc. thought that in a conventional solar cell structure comprised of a CdS film on which an InS film is stacked and further on which a ZnO film is formed, the difference between the lattice constants of the ZnO and the InS is large and defects at the junction interface obstruct improvement of the power generation efficiency of the solar cell.

This problem is solved in the present invention by inserting between the CdS buffer layer and the ZnO film a second buffer layer which is formed by a material which has a lattice constant which is closer to the lattice constant of the ZnO film than even CdS, for example, Zn(O,S) or Sn(O,S), instead of the InS buffer layer. Due to this, the mismatch of the lattice constants between the n-type high resistance buffer layer and the ZnO film is greatly suppressed and the produced solar cell is improved in open circuit voltage and open circuit voltage loss and, as a result, a compound-based thin film solar cell which has excellent photovoltaic conversion efficiency can be obtained.

DESCRIPTION

Figure 1:
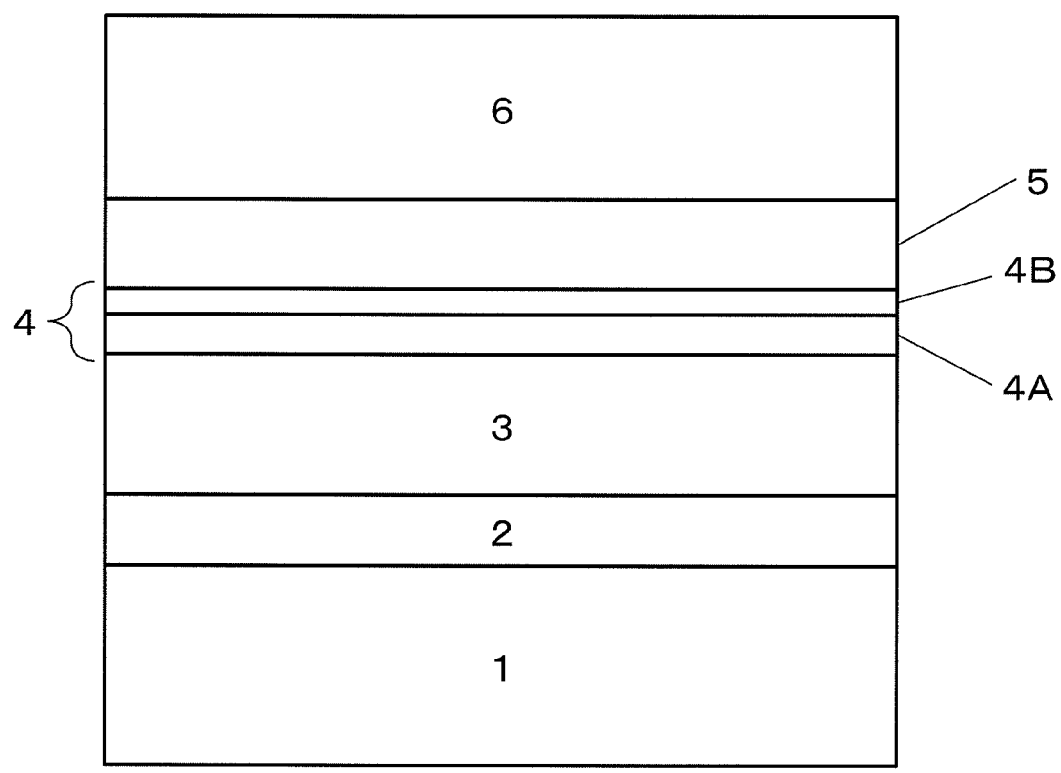
FIG. 1 is a view which shows the general structure of a compound-based thin film solar cell according to an embodiment of the present invention.

Below, various embodiments of the present invention will be explained while referring to the drawings. Note that in the following drawings, to facilitate understanding, the thicknesses of the different layers are shown different from the actuality. Further, in the drawings, the same notations show the same or similar components. Further, in the following embodiments, the case of configuring the present invention as a CZTS-based thin film solar cell is explained as an example, but the present invention is not limited to just this structure. The invention may be similarly applied to for example a CIS-based thin film solar cell or a CIGS-based thin film solar cell of course.

FIG. 1 is a schematic cross-sectional view which shows the structure of a compound-based thin film solar cell according to one embodiment of the present invention. In the present embodiment, a CZT(SSe)-based light absorption layer is used for the p-type light absorption layer. Specifically, it is $Cu_2ZnSn(S,Se)_4$. In the figure, 1 indicates a glass substrate, 2 a metal back surface electrode layer which uses Mo or another metal as a material, 3 a p-type CZT(SSe)-based light absorption layer, 4 an n-type high resistance buffer layer, 5 a ZnO film, and 6 an n-type transparent conductive film. The p-type CZT(SSe)-based light absorption layer 3 is, for example, formed by successively stacking Cu, Zn, and Sn on the back surface electrode layer 2 by the sputter method, electron beam deposition, etc. to form a metal precursor film, and sulfurizing and selenizing the same. Further, the CZT(SSe)-based light absorption layer 3 may also be formed by another method, called a solution coating method. In this method, a surface of the metal back surface electrode layer 2 is coated with a solution which contains Cu, Zn, Sn, Se and S, and thereafter annealed, sulfurized and/or selenized to form the p-type CZT(SSe)-based light absorption layer 3.

In the present embodiment, the n-type high resistance buffer layer 4 is formed from a first buffer layer 4A which is comprised of CdS or InS and a second buffer layer 4B. The second buffer layer 4B is, for example, formed using ZnS or SnS as a material. The buffer layers 4A and 4B are usually formed using the chemical bath deposition method (CBD method). The "CBD method" dips a base member into a solution which contains a chemical species forming the precursor and makes an uneven reaction advance between the solution and the base member surface so as to cause a thin film to deposit on the base member. For this reason, the formed buffer layers 4A and 4B include O and OH rather than pure CdS, InS, ZnS, and SnS.

Therefore, these buffer layers are also called CdS-based buffer layers, InS-based buffer layers, ZnS-based buffer layers, and SnS-based buffer layers.

In FIG. 1, the ZnO film 5 is formed by an intrinsic zinc oxide (i-ZnO) film with a thickness of 50 to 100 nm. The n-type transparent conductive film 6 is formed using a material which has an n-type conductivity, has a wide band gap, and is transparent and low in resistance, to a thickness of 0.05 to 2.5 μm. Typically, there is a zinc oxide-based thin film (ZnO) or ITO thin film. In the case of a ZnO film, it is possible to add a Group III element (for example, Al, Ga, and B) as a dopant to make a low resistance film. The n-type transparent conductive film 6 can also be formed by the sputter method (DC, RF) etc. in addition to the MOCVD method.

Note that, while explained later shown in FIG. 3, when forming the n-type transparent conductive film 6 by n-type ZnO, the intrinsic ZnO film 5 may also be omitted.

Next, the feature of the present invention of the n-type high resistance buffer layer 4 will be explained in further detail. The n-type high resistance buffer layer 4 of one embodiment of the present invention is formed from a first buffer layer 4A which is comprised of CdS or InS and a second buffer layer 4B. For the second buffer layer 4B, a material which has a lattice constant B which is closer to the lattice constant K of ZnO which forms the intrinsic ZnO film 5 than the lattice constant A of the first buffer layer 4A is selected. That is, a first buffer layer 4A which has a lattice constant A and a second buffer layer 4B which has a lattice constant B which satisfy $$|B-K|<|A-K|$$

are used to form an n-type high resistance buffer layer 4.

Figure 2:
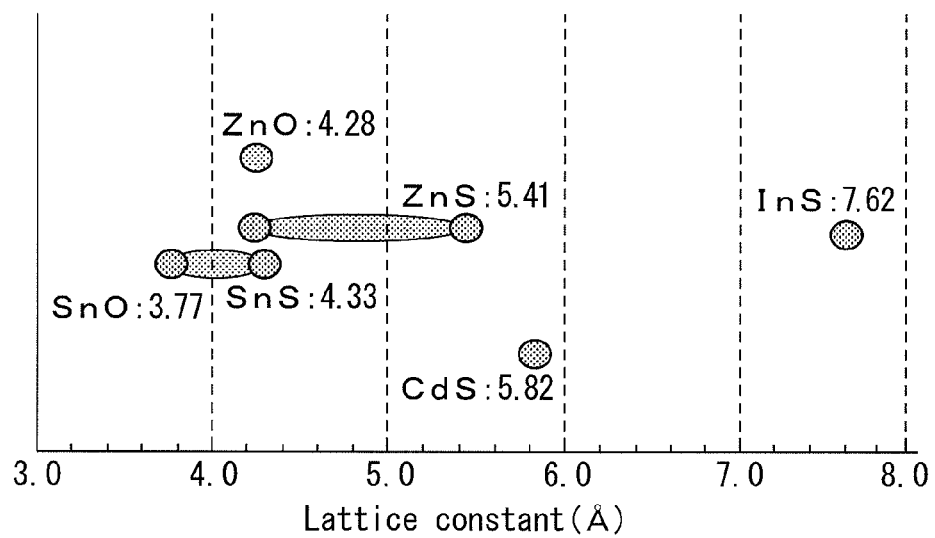
FIG. 2 is a view which shows a lattice constant of a buffer layer material.

FIG. 2 is a graph which shows the lattice constants of CdS, InS, Zn(O,S), and Sn(O,S). In this figure, the abscissa indicates the lattice constant in angstroms (Å), while the ordinate has no particular meaning. From FIG. 2, it is learned that the lattice constant of the CdS which is used as the material of the first buffer layer 4A is 5.82 and the lattice constant of InS is 7.62.

On the other hand, the lattice constant of the ZnS (not containing oxygen) of the material of the second buffer layer 4B is 5.41. As the ratio of content of the O in Zn(O,S) becomes higher, the lattice constant tends to become smaller. Further, the lattice constant of Sn(O,S) of another example of the second buffer layer 4B is 4.33 in the case of SnS and becomes smaller as the oxygen concentration becomes higher. With SnO, it becomes 3.77.

Note that the notation Zn(O,S) indicates that this material is a mixed crystal of ZnO and ZnS, while Sn(O,S) indicates a mixed crystal of SnO and SnS.

Here, if combining the second buffer layer 4B using Zn(O, S) as a material with the first buffer layer 4A which is formed by CdS, the difference between the lattice constant A of the first buffer layer 4A and the lattice constant K of ZnO becomes, from FIG. 2, $$|A-K|=|5.82-4.28|=1.54$$

On the other hand, when the content of oxygen in Zn(O,S) is 0, the difference between the lattice constant B of the second buffer layer 4B and the lattice constant K of ZnO becomes $$|B-K|=|5.41-4.28|=1.13$$

and the relationship of |B−K|<|A−K| is satisfied. When the content of oxygen in Zn(O,S) is 100%, |B−K| becomes 0, so naturally the relationship of |B−K|<|A−K| is satisfied. Therefore, the mixed crystal Zn(O,S) becomes a suitable second buffer layer material when the first buffer layer is CdS.

As another embodiment of the present invention, consider the case of forming the first buffer layer 4A by CdS and forming the second buffer layer 4B by a mixed crystal Sn(O, S). In this case, the difference |A−K| of the lattice constants between the first buffer layer 4A and the ZnO film is 1.54 from FIG. 2, while, when the ratio of content of oxygen in the Sn(O,S) is 0, the difference in the lattice constant B of the second buffer layer 4B and the lattice constant K of ZnO becomes $$|B-K|=|4.33-4.28|=0.05$$

and the relationship of |B−K|<|A−K| is satisfied. When the content of oxygen in Sn(O,S) is 100%, |B−K|=|3.77−4.28|=0.51, so the relationship of |B−K|<|A−K| is satisfied.

Therefore, when forming the first buffer layer 4A by CdS and forming the second buffer layer 4B by either Zn(O,S) or Sn(O,S), mismatch of the lattice constants between the n-type high resistance buffer layer 4 and the ZnO film 5 is suppressed and a reduction in the open circuit voltage loss and in turn improvement of the open circuit voltage can be realized. In particular, when forming the second buffer layer by Sn(O,S), it is believed that the effect is large.

As still another embodiment of the present invention, it may be considered to form the first buffer layer 4A by InS and the second buffer layer 4B by Zn(O,S) or Sn(O,S). From FIG. 2, the lattice constant of InS is 7.62 or larger than the lattice constant of CdS, so the lattice constant of the second buffer layer 4B becomes closer to the lattice constant of ZnO than the lattice constant of the first buffer layer 4A. As a result, mismatch of the lattice constants between the n-type high resistance buffer layer 4 and the ZnO film can be suppressed and a decrease in the open circuit voltage loss and in turn improvement of the open circuit voltage can be realized.

The inventors conducted the following experiments so as to confirm the effect of improvement of the photovoltaic conversion efficiency in the compound-based thin film solar cell of the structure which is shown in FIG. 1. That is, two solar cell samples which have the features of the present invention and two solar cell samples which do not have the features of the present invention were formed and measured for electrical characteristics.

The following Table 1 shows the results of the experiment.

TABLE 1

|  | Sample 1 | Sample 2 | Sample 3 | Sample 4 |
|---|---|---|---|---|
| n-type high resistance buffer layer | CdS | CdS + InS | CdS + Zn(O, S) | CdS + Sn(O, S) |
| Eg [eV] | 1.17 | 1.19 | 1.17 | 1.09 |
| Voc [mV] | 453 | 477 | 483 | 470 |
| Voc, def [mV] | 717 | 715 | 687 | 618 |
| Loss rate | 0.613 | 0.600 | 0.587 | 0.568 |

In Table 1, Sample 1 and Sample 2 are solar cell samples which do not have the features of the present invention, while Sample 3 and Sample 4 are solar cell samples which have the features of the present invention. The features of the samples were as follows:

<Sample 1> n-type high resistance buffer layer as a whole formed by CdS.

<Sample 2> n-type high resistance buffer layer formed by stacking CdS and InS.

<Sample 3> n-type high resistance buffer layer formed by first buffer layer using CdS as material and second buffer layer using Zn(O,S) as material.

<Sample 4> n-type high resistance buffer layer formed by first buffer layer using CdS as material and second buffer layer using Sn(O,S) as material.

Note that the n-type high resistance buffer layer in each of the samples is formed by the CBD method and has a thickness of 70 nm or so. In Sample 3 and Sample 4, the first buffer layer (CdS) has a thickness of about 50 nm and the second buffer layer (Zn(O,S) or Sn(O,S)) has a thickness of about 20 nm. The structures and methods of production of the different layers other than the n-type high resistance buffer layer are made the same in Samples 1 to 4.

The following Table 2 summarizes the structures and methods of production of the respective parts other than the configuration and method of formation of the n-type resistance layer.

TABLE 2

| Substrate 1 | | Glass substrate |
|---|---|---|
| Metal back surface electrode layer 2 | Composition | Mo |
|  | Film forming method | DC sputter method |
|  | Film forming pressure | 0.5 to 2.5 Pa |
|  | Film forming power | 1.0 to 3.0 W/cm$^2$ |
| p-type CZTS-based light absorption layer 3 | Composition | Cu$_2$ZnSn(S, Se)$_4$ |
|  | Thickness | 1 to 2 μm |
|  | Film forming method | Solution coating method |
| Intrinsic ZnO film 5 | Composition | i-ZnO |
|  | Thickness | 50 to 100 nm |
|  | Film forming method | RF sputter method |
| n-type transparent conductive film 6 | Composition | ITO |
|  | Thickness | 50 to 200 nm |
|  | Film forming method | DC sputter method |

In Table 1, Eg shows the band gap of the light absorption layer which is calculated from the external quantum efficiency (EQE) curve. Voc shows the open circuit voltage, while Voc, def shows the open circuit voltage loss which is found from Eg−Voc. Further, the loss rate shows the ratio of the open circuit voltage loss Voc, def to the band gap Eg found by Voc, def/Eg.

From the results of the above Table 1, it is learned that compared with the conventional structure Sample 1, in the conventional structure Sample 2, the open circuit voltage loss (Voc, def) does not change, but the open circuit voltage (Voc) is improved. The loss rate is improved from 0.613 to 0.600. From this as well, it is learned that the open circuit voltage loss is suppressed. This is believed to be an effect, in Sample 2, of the formation of an InS film between the CdS film and the i-ZnO film to eliminate the effects of cracks at the CdS film.

On the other hand, if looking at the results of measurement of Sample 3 and Sample 4 according to the present invention, it is learned that the open circuit voltage loss (Voc, def) is improved over the conventional structure Sample 2. In particular, in Sample 4 according to the present invention where the second buffer layer is formed by Sn(O,S), the loss rate is improved up to 0.568 compared with the 0.600 of the conventional Sample 2. It is learned that the effect is remarkable.

The reason why the open circuit voltage characteristics of the Samples 3 and 4 according to the present invention are improved over the conventional structure Sample 2 is believed to be that the second buffer layer (Zn(O,S) or Sn(O, S)) greatly approaches the lattice constant of the ZnO film (i-ZnO) compared with InS and therefore mismatch of the lattice constants with the ZnO film is suppressed.

The experiments which are shown in Table 1 relate to the case of forming a CdS film as a first buffer layer on the p-type light absorption layer as the Samples 3 and 4 according to the present invention, but even when forming a film which has a lattice constant larger than the lattice constant of ZnO by the first buffer layer instead of the CdS film, it is possible to form the compound-based thin film solar cell according to the present invention.

For example, by forming an InS film as the first buffer layer and forming over that a film of Sn(O,S) or Zn(O,S) as well, it is possible to obtain a compound-based thin film solar cell which can realize a reduction of the open circuit voltage loss. When forming an InS film as the first buffer layer and forming over that a ZnO film 5, the difference in the lattice constants between the InS film and the ZnO film becomes 3.34 (7.62−4.28). On the other hand, if applying the present invention to form a second buffer layer which has a lattice constant closer to the ZnO film than the InS film (for example, Sn(O,S) or Zn(O,S)) between the first buffer layer constituted by the InS film and the ZnO film 5, the difference in lattice constants between the ZnO film and the second buffer layer becomes smaller than the above-mentioned 3.34. As a result, the mismatch in the lattice constants between the n-type high resistance buffer layer and the ZnO film is suppressed and reduction of the open circuit voltage loss and in turn improvement of the open circuit voltage can be realized.

Figure 3:
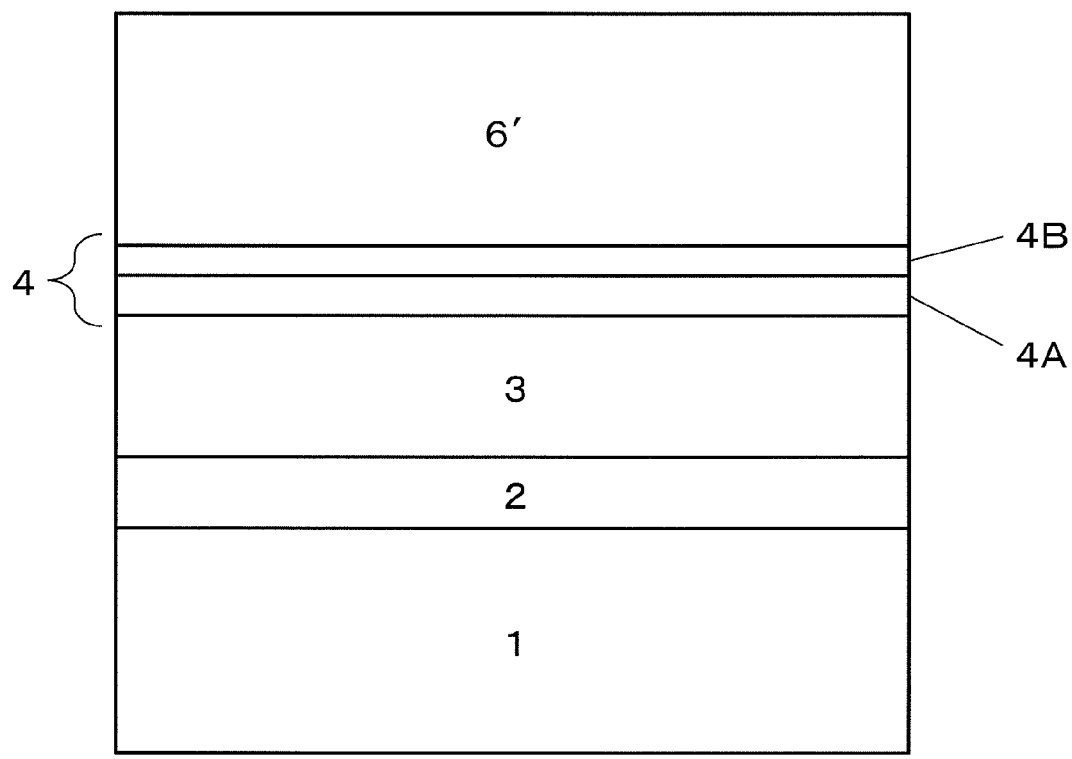
FIG. 3 is a view which shows the general structure of a compound-based thin film solar cell according to another embodiment of the present invention.

FIG. 3 is a schematic cross-sectional view which shows the structure of a compound-based thin film solar cell according to another embodiment of the present invention. In this solar cell, the transparent conductive film 6' is formed by ZnO which includes an n-type dopant. For this reason, the second buffer layer 4B may be formed directly with an N-type ZnO film 6' without formation of an i-ZnO film. Note that the structures of the first and second buffer layers 4A and 4B are similar to the solar cell which is shown in FIG. 1.

Note that, the Samples 3 and 4 according to the present invention in Table 1 are provided with p-type light absorption layers 3 of compositions of $Cu_2ZnSn(S, Se)_4$, but the present invention is not limited to this. It is clear that even with $Cu_2ZnSnSe_4$ or $Cu_2ZnSnS_4$, similar effects can be obtained. Further, as a method for forming the p-type light absorption layer 3, a metal precursor film is formed on the metal back surface electrode, and thereafter the metal precursor film is selenized and/or sulfurized. In this instance, other than successively forming Zn, Sn, and Cu films as a metal precursor film, a sputtering target obtained by alloying two or three of Zn, Sn, and Cu in advance or a sputtering target which is comprised of these selenides and/or sulfides. As the method of formation, in addition to the sputtering method, the simultaneous vapor deposition method or EB deposition method may be used.

Further, the substrate 1, the metal back surface electrode layer 2, and the n-type transparent conductive film 6 are also not limited to the cases described in Table 2. For example, as the substrate 1, a soda lime glass, low alkali glass, or other glass substrate and also a stainless steel sheet or other metal substrate, polyimide resin substrate, etc. may be used. As the method of forming the metal back surface electrode layer 2, in addition to the DC sputter method which is described in Table 2, there are the electron beam deposition method, atomic layer deposition method (ALD method), etc. As the material of the metal back surface electrode layer 2, a high corrosion resistant and high melting point metal such as chrome (Cr), titanium (Ti), etc. may be used.

Further, instead of a CZTS-based semiconductor, a CIS-based semiconductor or CIGS-based semiconductor can be used to form a light absorption layer. In this case as well, similar effects can be expected.

REFERENCE SIGNS LIST 1 substrate
2 metal back surface electrode layer
3 p-type CZTS-based light absorption layer
4 n-type high resistance buffer layer
4A first buffer layer
4B second buffer layer
5 i-ZnO film
6 n-type transparent conductive film

What is claimed is:

1. A compound-based thin film solar cell comprising:
a substrate,
a back surface electrode layer which is formed on said substrate,
a p-type light absorption layer which is formed on said back surface electrode layer,
an n-type high resistance buffer layer which is formed on said p-type light absorption layer,
an intrinsic ZnO film which is formed on said n-type high resistance buffer layer, and
an n-type transparent conductive film formed on the intrinsic ZnO film, wherein
said n-type high resistance buffer layer includes a first buffer layer which is formed on said p-type light absorption layer and a second buffer layer which is formed on said first buffer layer, and said second buffer layer is formed by Zn(O, S) or Sn(O, S) which has a lattice constant which is closer to the lattice constant of said intrinsic ZnO film than a lattice constant of said first buffer layer is.

2. The compound-based thin film solar cell according to claim 1, wherein said first buffer layer is formed by CdS.

3. The compound-based thin film solar cell according to claim 1, wherein said first buffer layer is formed by InS.

4. The compound-based thin film solar cell according to claim 1, wherein said n-type transparent conductive film is formed of a ZnO film including an n-type dopant.

5. The compound-based thin film solar cell according to claim 1, wherein said n-type transparent conductive film is formed of an ITO film.

6. The compound-based thin film solar cell according to claim 1, wherein said p-type light absorption layer is formed by a CZTS-based semiconductor which includes at least Cu, Zn, Sn, and VI materials.

7. The compound-based thin film solar cell according to claim 1, wherein said p-type light absorption layer is formed by a CIS-based semiconductor which includes at least Cu, In, and VI materials.

8. The compound-based thin film solar cell according to claim 2, wherein said first buffer layer has a thickness of 20 to 100 nm and said second buffer layer has a thickness of 10 to 50 nm.

9. The compound-based thin film solar cell according to claim 1, wherein the second buffer layer is formed by Sn(O, S).

* * * * *